(12) United States Patent
Douglas

(10) Patent No.: US 7,030,599 B2
(45) Date of Patent: *Apr. 18, 2006

(54) HAND HELD VOLTAGE DETECTION PROBE

(75) Inventor: Philip Norris Douglas, Clayton, NC (US)

(73) Assignee: Santronics, Inc., Sanford, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/952,982

(22) Filed: Sep. 29, 2004

(65) Prior Publication Data

US 2005/0046408 A1 Mar. 3, 2005

Related U.S. Application Data

(63) Continuation of application No. 10/101,578, filed on Mar. 20, 2002, now Pat. No. 6,828,767.

(51) Int. Cl.
*G01R 31/02* (2006.01)

(52) U.S. Cl. .................................................... 324/72.5

(58) Field of Classification Search ............... 324/72.5
See application file for complete search history.

(56) References Cited

U.S. PATENT DOCUMENTS 5,773,974 A * 6/1998 Kraz ......................... 324/258
6,828,767 B1 * 12/2004 Douglas .................... 324/72.5

* cited by examiner

*Primary Examiner*—Anjan Deb
*Assistant Examiner*—John Teresinski

(57) ABSTRACT

A switchless, hand-held probe and method for detecting and alerting a user to the presence of an AC voltage on a conductor that minimizes the intermittent activation of the probe's indicator due to static charge build-up. The probe includes an antenna, an indicator, and activation and detection circuitry. The probe alerts a user through the use of an indicator to the presence of electrical energy on a conductor. The antenna senses the electrical energy radiated from the conductor. When the electrical energy sensed by the antenna satisfies a particular measurement threshold a plurality of times during a period of time, the activation and detection circuitry activates the indicator.

9 Claims, 13 Drawing Sheets

HAND HELD VOLTAGE DETECTION PROBE

This application is a continuation of U.S. patent application Ser. No. 10/101,578 filed on Mar. 20, 2002 now U.S. Pat. No. 6,828,767, which is incorporated by reference herein in its entirety.

TECHNICAL FIELD

The present invention relates to the field of test equipment, and more particularly to a hand-held probe to sense the presence of an alternating current (AC) signal voltage on a conductor.

BACKGROUND ART

Hand-held electrical probes are known in the art for detecting the presence of AC signal potential on a conductor. The probes are either of a contacting type which requires direct electrical contact with an uninsulated portion of the conductor, or of a noncontacting type which senses the resulting electromagnetic field when placed in proximity to the conductor. There is a safety risk associated with the contacting type probe due to the possibility that the user may receive a harmful electrical shock, so that the noncontacting type probe is preferable.

Since both type probes use a visual and/or audible indicator to annunciate the presence of a detected voltage potential to a user, many of the probes have manual on/off switches that allow a user to deactivate the probe when not in use. The switch, however, presents a number of disadvantages. If the switch is made of metal, it can act as a conduit to shock and injure the user if the switch comes in contact with a "live" wire or circuit. A user may forget to turn the switch on before using it, thereby risking a false negative reading, or a user may forget to turn it off causing the batteries to run down. A manual on/off switch can also break with repeated usage over an extended period of time. Therefore, it is preferable for a user to have a probe that does not rely on the use of a manual on/off switch.

U.S. Pat. No. 5,103,165 discloses an improved, switchless type probe that may be contacting or noncontacting. In a best mode embodiment the '165 probe housing comprises non-conductive material, such as polyvinylchloride ("PVC"), to reduce the risk of electrical shock for a user, and it eliminates the use of a switch through the use of internal circuitry that automatically activates the probe when it senses an electrical current or voltage, thereby reducing the drain on the batteries. The probe disclosed in the '165 patent provides a visual indicator to alert the user to the presence of an electrical current or voltage, but does not have an audible indicator. The insulated housing of the '165 probe, however, presents a problem with static charge build-up, which causes flickering of the visual indicator and would cause chirping of an audible indicator. The static build-up may occur when the probe is rubbed on cloth, such as a user's pocket or sleeve. This intermittent flickering and/or chirping may be annoying to the user, and it would also drain the batteries.

DISCLOSURE OF INVENTION

The present invention is to a switchless, hand-held probe for detecting and annunciating the presence of AC voltage signals on a conductor, which incorporates filtering circuitry that minimizes intermittent activation of the probe's indicator due to static charge build-up. The probe of the present invention comprises an antenna adapted to sense the electrical energy radiated by the AC voltage on the conductor, detector circuitry responsive to the sensed electrical energy at the antenna for providing an electrical signal when the electrical energy at the antenna satisfies certain magnitude and duration thresholds, an indicator to alert a user to the presence of the sensed electrical energy, and activation circuitry connected to the detector circuitry and adapted to activate the indicator only when a sufficient number of signals are received from the detector circuitry during a period of time, thus minimizing the intermittent activation of the probe's indicator due to static charge build-up and any associated drain on the batteries thereby.

In the present hand-held probe, the detector circuitry establishes energy thresholds concerning the electrical energy sensed by the antenna. The detector circuitry filters both the magnitude and frequency of the sensed electrical energy. When the sensed electrical energy satisfies the energy thresholds, an electrical signal, which may vary in frequency and duration, is produced by the detector circuitry and received by the activation circuitry. The activation circuitry functions as a switch by activating the indicator only when a sufficient number of signals are received from the detector circuitry during a given period of time. If enough signals are not received by the activation circuitry from the detector circuitry, the indicator will not be activated.

In one embodiment of the invention, the probe includes an antenna adapted to sense the electrical energy radiated from a conductive member when the probe is positioned adjacent the member; an indicator adapted to alert a user when activated; detector circuitry comprising a first inverter, connected to the antenna, adapted to respond to a range of voltages sensed on the antenna, and a second inverter, connected to the first inverter, adapted to respond each time the output voltage of the first inverter changes; and activation circuitry comprising a capacitor, connected to the second inverter and indicator, adapted to charge on receipt of the signal from the second inverter for activating the indicator when the capacitor is charged sufficiently, and an oscillator adapted to periodically discharge the capacitor.

These and other objects, features, and advantages of the present invention will become more apparent in light of the following detailed description of a best mode embodiment thereof, as illustrated in the accompanying Drawing.

DETAILED DESCRIPTION

Figure 1:
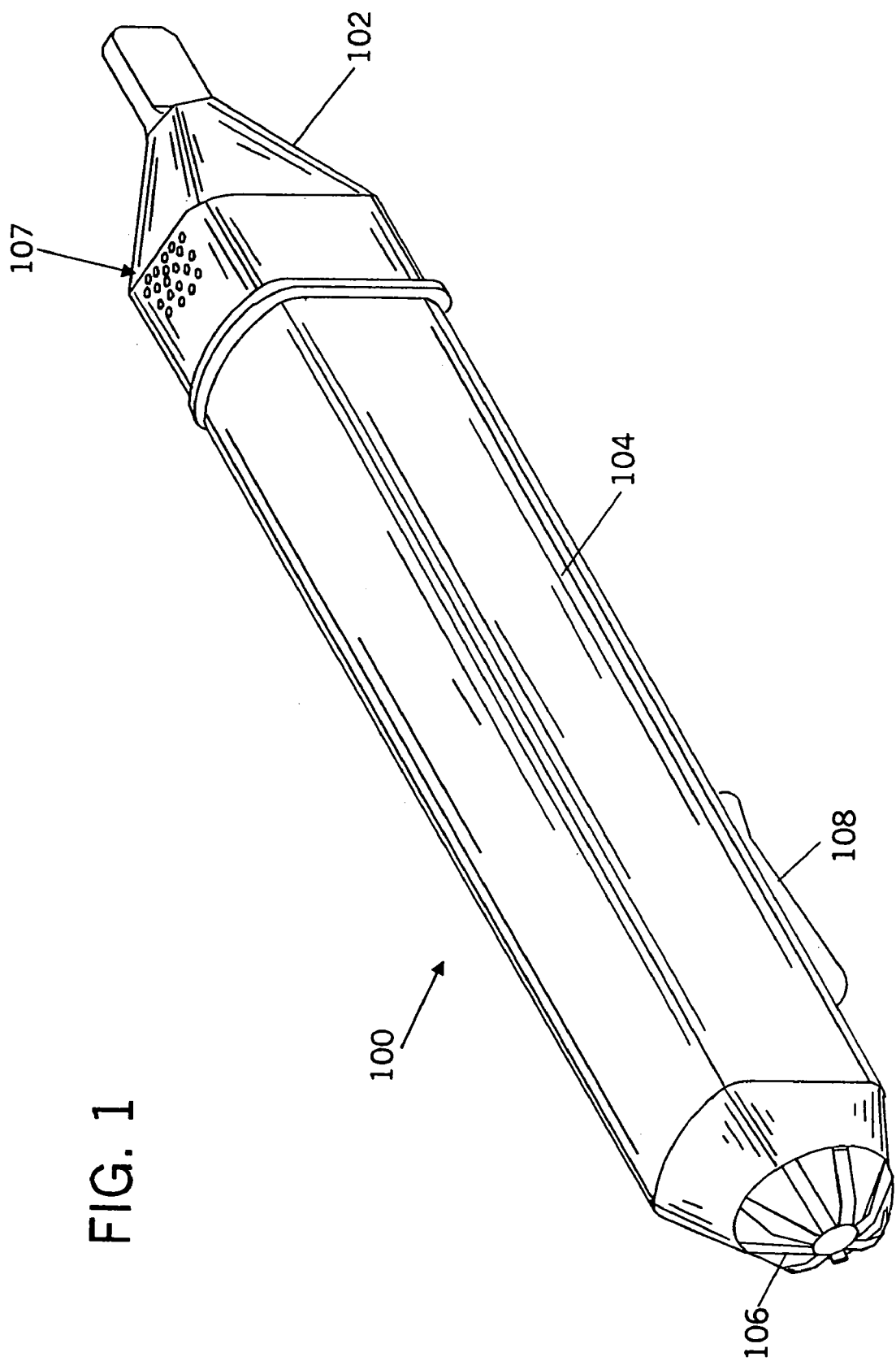
FIG. 1 is a perspective illustration of one embodiment of a hand-held electrical probe according to the present invention.

Referring to FIG. 1, a hand-held electrical probe is generally shown at 100. The probe 100 includes a probe tip 102 attached to one end of a hollow housing 104 and a cap 106 threadably attached on an opposite end of the housing 104. Sound holes 107 pass through the probe tip 102 to an audible indicator in the interior so that sound may pass when the audible indicator is activated. A clip 108 is connected to the housing 104 and is used to attach the probe 100 to an object such as a user's pocket.

Figure 2:
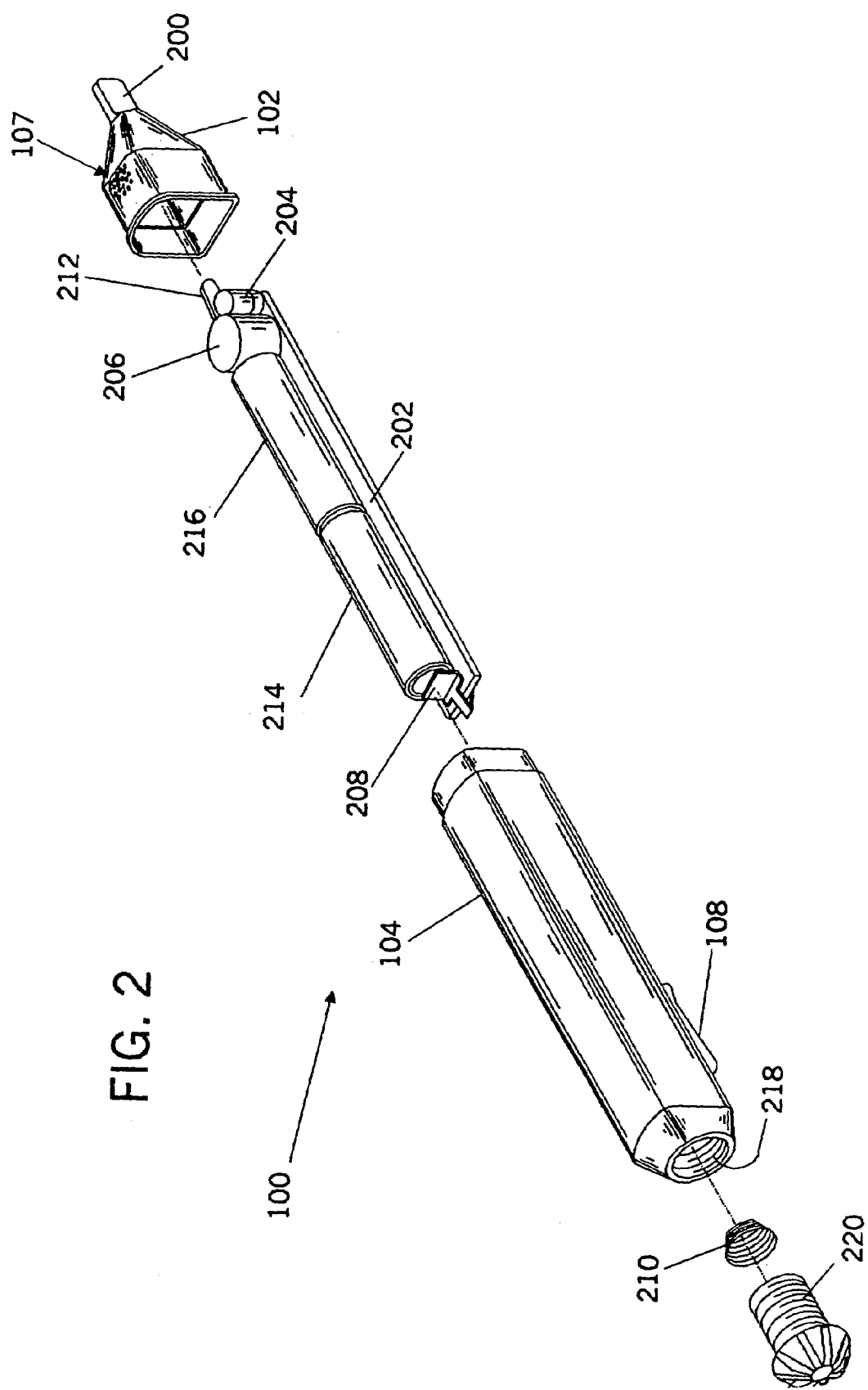
FIG. 2 is an exploded view of the embodiment of FIG. 1.

Referring now to FIG. 2, the probe 100 is illustrated in an exploded view in more detail. The probe tip 102 has a hollow interior and tip extension 200. The probe tip 102 is formed of light-transmissive polyvinylchloride (PVC) material. The hollow interior of the housing 104 and probe tip 102 contain a circuit board 202. The circuit board 202 is mounted in the housing 104 in a manner that is well known to those skilled in the art. The circuit board 202 includes circuitry (described in further detail hereinafter and shown in FIGS. 3A and 3B), including an integrated circuit and an electromagnetic field indicator in the form of a light-emitting diode 204 and an audible indicator 206, or colloquially known as a "buzzer". In this embodiment, the indicators may be activated by the application of power. An antenna 212, which is electrically conductive and formed of brass in this embodiment, is connected to the circuit board 202 at one end. The opposite end of the antenna 212 is embedded in the tip extension 200 of the probe tip 102 so as to detect electromagnetic fields without contacting the source of the energy. The circuit board 202 is connected to the antenna 212 in order to receive signals indicating the presence of a detected electromagnetic field.

In order to reduce the possibility of electrical shock to the user, the probe tip 102, housing 104, and cap 106 of the probe 100 are formed entirely of a non-conductive material, such as an impact-resistant plastic, which is polyvinylchloride (PVC) in this embodiment. The probe tip 102 and housing 104 are attached by an adhesive.

The housing 104 contains two small batteries, shown at reference numerals 214 and 216, for providing power to the circuitry of the probe 100. In this embodiment the batteries are each 1.5 volts. A pole at one end of the battery 216 is engaged with a front contact (not shown) attached near the right end of the circuit board 202. The batteries 214 and 216 have low and high voltage outputs. The front contact is a leaf-type spring in this embodiment. A flexible contact 208 is attached to the left end of circuit board 202 and is connected to the circuitry to complete an electrical circuit through the batteries 214 and 216. The flexible contact 208 is formed of brass in this embodiment, but may alternatively be formed of another suitable conducting material. The flexible contact 208 may be bent in one direction into contact with an adjacent pole of the battery 214 and is held in such engagement by a coil spring 210. The flexible contact 208 is also movable into a straight-line position to permit the insertion and removal of the batteries 214 and 216 from the interior of the housing 104.

The left end of the housing 104 is provided with internal screw threads 218 that mate with external screw threads 220 of the cap 106 for attachment and removal of the cap 106 from the housing 104. The coil spring 210 is mounted within the cap 106, so that when the cap 106 is attached to the housing 104, the coil spring 210 firmly engages the flexible contact 208 in firm electrical contact with the adjacent pole of battery 214, and to provide force on the batteries 214 and 216 to push them into the housing 104 so that the pole of the battery 216 is held in firm contact with the front contact of the circuit board 202, thus completing an electrical circuit between the batteries 214 and 216 and the circuit board 202.

As an alternative to the use of flexible contact 208, internal screw threads 218, and external screw thread 220, cap 106 and housing 104 may be attached using an electrical connector having a male end and a female end. The male end of the connector is mounted to circuit board 202 and is electrically connected to circuit 300 (see FIGS. 3A and 3B). The female end of the connector is mounted inside the cap 106 and is electrically connected to the coil spring 210. In this alternative embodiment, the attachment of cap 106 and housing 104 by joining the male and female ends of the connector forms an electrical circuit when the coil spring 210 firmly engages the adjacent pole of battery 214 pushing the batteries 214 and 216 into the housing 104 and in firm contact with the front contact of the circuit board 202.

Figure 3A:
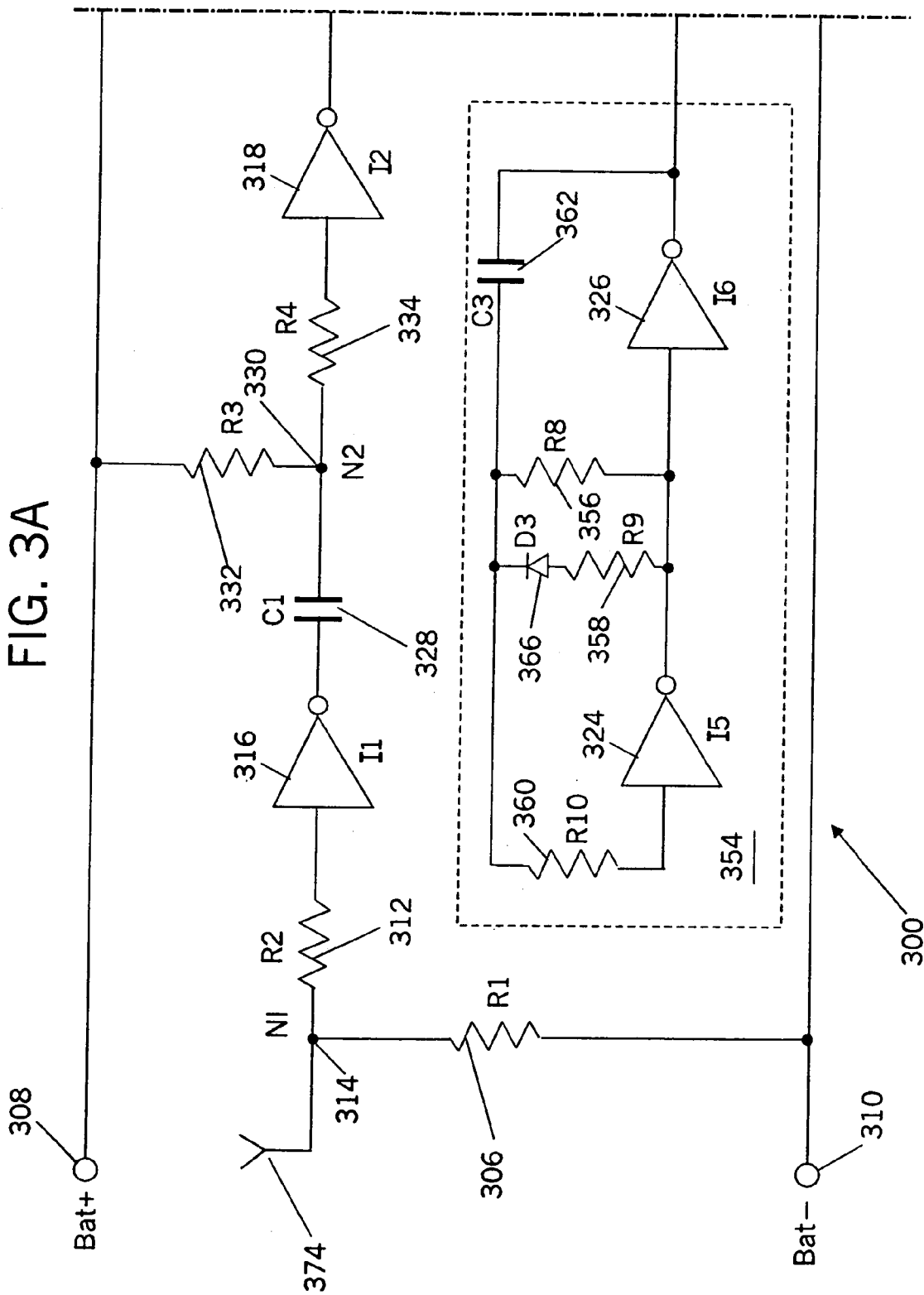
FIGS. 3A and 3B are a schematic diagram of circuitry used in the embodiment of FIGS. 1 and 9.
Figures 3, 3B:
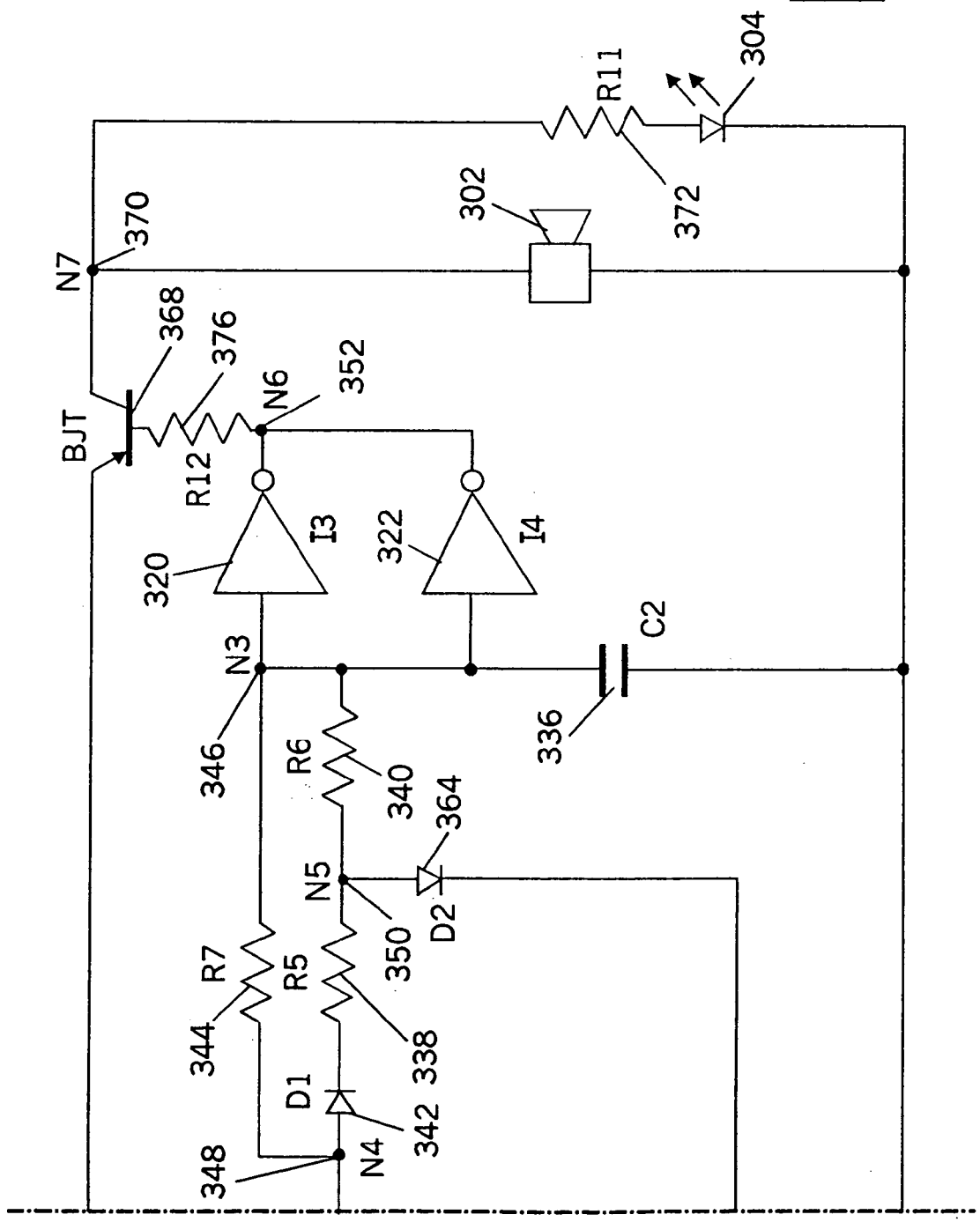

Now referring to FIGS. 3A and 3B, a schematic diagram of the circuit 300 included on the circuit board 202 as shown and located within the probe tip 102 and housing 104. The circuit 300 has an antenna 374 to sense the presence of electrical energy radiated from an electrically conductive member, such as a wire, when the probe is positioned near the member. In this embodiment, the circuit 300 functions to alert a user to the presence of electrical energy that has a constantly changing electromagnetic field. The circuit includes two indicators, an audible indicator 302 and a visual indicator in the form of an LED 304, that alert the user to the presence of certain electrical energy when activated. Furthermore, the circuit 300 includes circuitry connected to the antenna 374 to activate the indicators when the electrical energy sensed by the antenna 374 satisfies a measurement threshold for a certain period of time. In this embodiment, the measurement threshold is satisfied when the radiated electrical energy from the member is between approximately 50 to 400 hertz and is greater than approximately 40–50 volts. Activation circuitry is provided in circuit 300 that receives a signal each time the threshold conditions are met. If enough signals are received during a period of time, the indicators are activated.

In this embodiment, the circuit 300 uses a 3.0 volt power source, which is provided by the batteries 214 and 216 shown in FIG. 2. The batteries 214 and 216 connect to the circuit 300 at the nodes 308 (BAT+) and 310 (BAT−).

Antenna 374 senses electrical energy on an electrically conductive member when positioned near the member. The antenna 374 is connected to node 314 (N1). Electrical energy sensed by the antenna 374 causes a voltage to be produced at node 314. It is important that circuit 300 is sensitive only to certain electrical energy. In this embodiment, the configuration of resistor 306 (R1) and inverter 316 (I1) causes the circuit 300 to be sensitive only to the electrical energy that is detected by the antenna 374 above a certain voltage. In the preferred embodiment, resistor 306 is a 330 megaohm resistor and is connected between nodes 314 and 310. In this embodiment, the resistor 306 causes the circuit 300 to be sensitive to detected voltages that are greater than approximately 40–50 volts.

The circuit 300 includes an integrated circuit (IC) that contains several inverters shown individually on the schematic diagram of FIGS. 3A and 3B at reference numerals 316, 318, 320, 322, 324, and 326. The IC has the ability to perform many functions otherwise achievable by individual electrical components. The inverters (316, 318, 320, 322, 324 and 326) in this embodiment are CMOS Schmitt Trigger inverters. CMOS type circuits are known for low power consumption. The IC used in this embodiment can come from a variety of different companies such as Fairchild, Motorola, Texas Instrument or Toshiba. The batteries 214 and 216 supply power to the IC by connection at the appropriate pins on the IC as is known in the art. Additionally, the batteries 214 and 216 determine the threshold voltages and output for the inverters. For reference hereinafter, the high threshold voltage to an inverter is ⅔ the voltage of the power supplied to the IC, or 2.0 volts in this embodiment. Therefore, an input high to an inverter is a voltage greater than 2.0 volts in this embodiment. The low threshold voltage is ⅓ the voltage of the power supplied to the IC, or 1.0 volts in this embodiment. An output high from an inverter is approximately 3.0 volts, and an output low from an inverter is approximately zero. Furthermore, the batteries 214 and 216 provide power to the audible indicator 302 and LED 304 when activated.

Resistor 312 (R2) is a 100 megaohm resistor and is connected between node 314 and the input to inverter 316. The resistor 312 on the input to the inverter 316 serves to prevent high input current from damaging the IC.

When the antenna 374 is in close proximity to an electromagnetic field, a voltage is produced at node 314 and at the input to inverter 316. When antenna 374 is not in the presence of an electromagnetic field (or a very small field), the output of the inverter 316 will be high because of the low voltage present at the input. When a signal with a voltage magnitude greater than the high threshold of the inverter 316 is present on the antenna 374 the inverter's output will be low. The amount of the signal voltage that appears at the input of inverter 316 is dependent upon the capacitance between the antenna 374 and the signal source (usually a wire), the resistance of resistor 306 and 312, and the input capacitance of the inverter 316.

Capacitor 328 (C1) and resistor 332 (R3) provide a high pass filter and are connected in a configuration between inverter 316 and inverter 318 (I2) in order to provide AC coupling and function as a differentiator. Capacitor 328 is a 0.01 microfarad capacitor that is connected between the output of inverter 316 and node 330 (N2). Resistor 332 is a 470 kiloohm resistor that is connected between nodes 330 and 308. The time constant of the capacitor 328 and resistor 332 is given by the multiplication of the capacitance value of capacitor 328 and the resistance value of resistor 332, which is 4.7 milliseconds. This feature functions to enable the circuit 300 to respond to only continuous time varying signals. This feature is helpful during operation, for example, when the distance varies between the probe tip 102 (see FIG. 1) and a wire that is probed, thus, causing a varying sensed signal. This varying of the distance, possibly due to a user moving the probe, could potentially cause the voltage at inverter 316 to vary enough to give an inaccurate reading. The differentiator is described in more detail hereinafter.

The output of inverter 318 changes in response to certain changes in the input of inverter 316. A voltage magnitude greater than the high threshold for inverter 316 will cause the output to inverter 316 to go high at certain frequencies. As discussed hereinbefore, this change will affect the voltage present at node 330 if it passes the differentiator configuration of capacitor 328 and resistor 332. Therefore, the configuration of inverter 316, resistor 306, capacitor 328, and resistor 332 serves to filter voltages present at node 314 (voltages from the antenna 374) that are at a certain minimum voltage and a certain frequency. Additionally, that configuration provides a logic input to inverter 318 when the filter conditions are met. When the filter conditions are met, the output of inverter 318 at node 348 (N4) will change from low to high. Otherwise, the output of inverter 318 is low. The operation of inverter 316, inverter 318, and the differentiator are described in more detail hereinafter.

Resistor 334 (R4) is a 1.0 megaohm resistor that is connected between node 330 and the input to inverter 318. The resistor 334 serves to prevent a high input current from damaging the IC.

When the output to inverter 318 is high, capacitor 336 (C2), which is a 0.33 microfarad capacitor, is charging. The capacitor 336 is charged through diode 342 (D1), resistor 338 (R5), and resistor 340 (R6) in parallel with resistor 344 (R7). The voltage on the capacitor during the time the capacitor 336 is charging is determined by the following equation (wherein V is the capacitor voltage, Vcc is the battery voltage (3.0 volts), Vc is the voltage existing on the capacitor 336, t is the time the capacitor is being charged, R is the resistance of resistors 338 and 340, and C is the capacitance of capacitor 336:

$$V=(Vcc-Vc)*(1-e^{(-t/(R*C))})$$

While the capacitor is being charged, its voltage increases exponentially with time.

The anode of diode 342 is connected to node 348. Diode 342 serves to prevent capacitor 336 from discharging into the inverter 318. Resistor 344 is a 2.2 megaohm resistor that is connected between node 348 and node 346 (N3). Resistor 344 functions to allow capacitor 336 to slowly discharge back into inverter 318.

Resistor 338 is a 47.0 kiloohm resistor that is connected between the cathode of diode 342 and node 350 (N5). Resistor 340 is a 47.0 kiloohm resistor that is connected between nodes 350 and 346. Resistors 338 and 340 determine the amount of charge added to capacitor 336 when a pulse of voltage is received from inverter 318.

The inputs to inverter 320 (I3) and inverter 322 (I4) are each connected to node 346, and the outputs of inverter 320 and 322 are connected to node 352 (N6). A 1.5 kiloohm resistor 376 (R12) is connected to node 352 and the base of bipolar junction transistor (BJT) 368 to limit the current into BJT 368.

The outputs to inverters 320 and 322 are high while the voltage on capacitor 336 is below the high threshold. When the capacitor 336 voltage is above the threshold voltage, their outputs are low. As detailed hereinafter, a low output on inverters 320 and 322 causes audible indicator 302 to sound and LED 304 to illuminate. Inverters 320 and 322 apply power through BJT 368 to the indicators 302 and 304.

An oscillator 354 is connected to capacitor 336 through resistor 340 and diode 364 (D2). The oscillator 354 serves as a timer to limit the amount of time that capacitor 336 is charged. The indicators will be activated only on the condition that capacitor 336 is charged beyond a certain threshold voltage during a period of time set by the oscillator 354. The oscillator 354 is an astable multivibrator that continuously produces an output signal that has a period determined by resistor 356 (R8), resistor 358 (R9), capacitor 362 (C3), inverter 324 (I5), and inverter 326 (I6). The oscillator 354 produces a non-symmetrical square wave with a peak-to-peak voltage of 3.0 volts. The capacitor 336 discharges when the oscillator's output is low. Therefore, in order for the indicators to activate, the voltage across capacitor 336 must be greater than the threshold voltage before oscillator 354 goes low. The capacitor 336 will charge only when the oscillator is high and the output from inverter 318 is high. In this embodiment, the time period that the oscillator's output is low is approximately 174 milliseconds, and the time period that the oscillator's output is high is approximately 290 milliseconds in this embodiment. The oscillator 354 discharges through resistor 340 and diode 364 when the oscillator's output is low. Diode 364 serves to keep the oscillator's output from charging capacitor 336 when the oscillator's output is high.

In this embodiment, resistor 356, resistor 358, and capacitor 362 are 180 kiloohms, 270 kiloohms, and 1.0 microfarads respectively. The oscillator 354 further includes resistor 360 (R10), which is 1.0 megaohm resistor, and diode 366 (D3). Resistor 360 functions to limit the current into the inverter 324. When the output of the oscillator 354 is low, capacitor 336 is discharged through resistor 340 and diode 364. This reduces the voltage on capacitor 362 below the low threshold causing the output of inverters 320 and 322 to go high. The time required for capacitor 336 to discharge to the low threshold of inverter 320 and 322 is given by the following equation (wherein Vc is the voltage on capacitor 336 before discharge, R is the resistance of resistor 340, C is the capacitance of capacitor 336 and V is the low threshold voltage of the inverter):

$$T = -R*C*ln(V/Vc)$$

Figure 4:
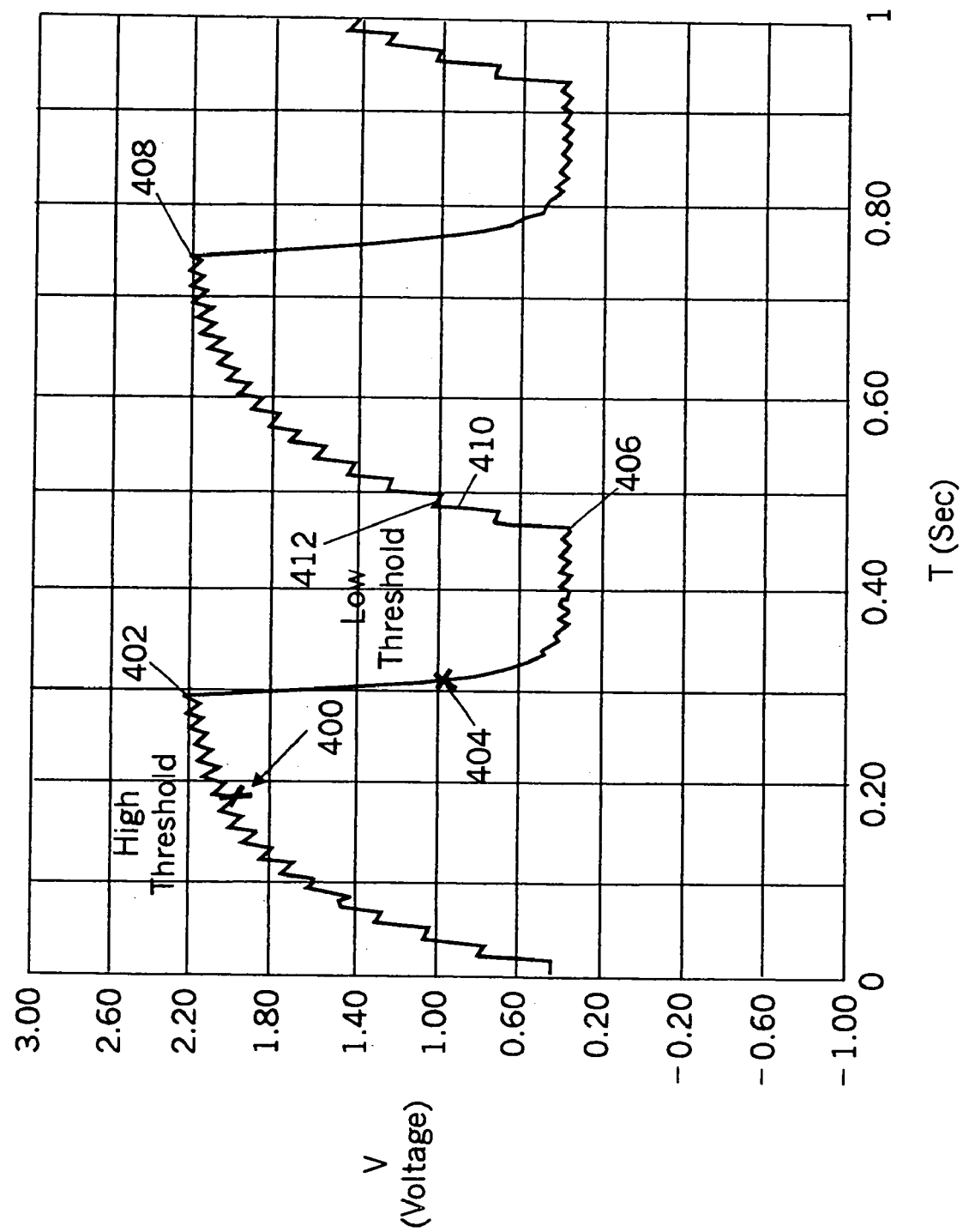
FIG. 4 is a signal waveform illustration that is used in the description of operation of the circuitry of FIGS. 3A and 3B.

Referring now to FIG. 4, a voltage versus time diagram illustrates the voltage across capacitor 336 over time while there is a 60 Hz signal at the antenna 374 above the voltage threshold. The voltages at which the inputs to inverters 320 and 322 are at high and low threshold are shown at reference numerals 400 and 404 respectively. The period of time that begins when the voltage goes to the high threshold of the inverter 400 to the time the voltage goes to the low threshold at 404 is the time period that the indicators are activated (as described in further detail hereinafter). As this voltage varies between the low threshold and the high threshold of inverters 320 and 322, the outputs of these inverters change from high to low and back to high. This occurs at the frequency rate of the oscillator 354. The period of time that begins at reference number 402 to 406 indicates when the capacitor 336 is discharging. From the time referenced by 406 to 408, it is indicated when the capacitor 336 is charging. Reference numeral 410 indicates the time period in which the inverter 318 is charging the capacitor 336 with a pulse. Reference numeral 412 indicates the time period in which the inverter 318 is not pulsing and the capacitor 336 is discharging through resistor 344.

Referring back to FIGS. 3A and 3B, the configuration of inverter 320, inverter 322, and BJT 368 functions as a switch for activating the indicators. The switch is turned on when the voltage at capacitor 336 reaches the high threshold of inverters 320 and 322. When inverter 320 and inverter 322 have a high output, no battery power is applied to audible indicator 302 or LED 304. A low output turns on BJT 368, thereby applying battery power to node 370 (N7). The BJT 368 is connected as follows: the emitter is connected to node 308; the base is connected to resistor 376; and the collector is connected to node 370.

When battery power is applied to node 370 the indicators, audible indicator 302 and LED 304, are activated, thereby alerting the user to the presence of a constantly changing AC voltage above a certain voltage threshold. The audible indicator 302 is connected between nodes 370 and 310. A 150 ohm resistor 372 (R11) and LED 304 are connected in series between nodes 370 and 310. When powered, the audible indicator 302 and LED 304 activate (switch on and off) at the oscillator's frequency rate. In this embodiment, the indicators will be on for approximately 290 milliseconds and off for approximately 174 milliseconds.

Figure 5:
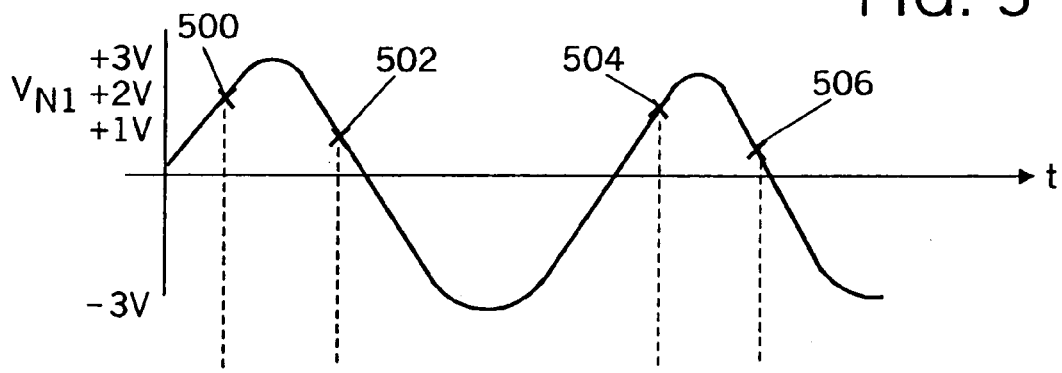
FIG. 5 is another signal waveform illustration that is used in the description of operation of the circuitry of FIGS. 3A and 3B.
Figure 6:
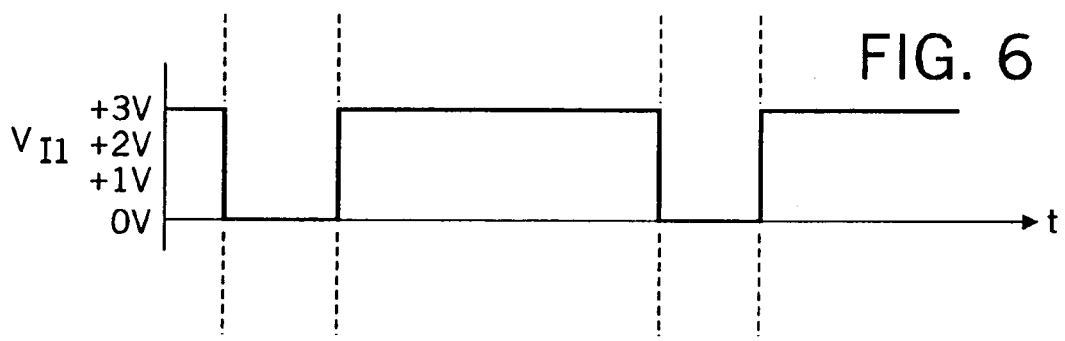
FIG. 6 is still another signal waveform illustration that is used in the description of operation of the circuitry of FIGS. 3A and 3B.

Referring to FIGS. 5–8, voltage versus time diagrams are provided to illustrate the operation of the differentiator of the present invention. These voltages indicate the voltages present at various points on the circuit 300 during the same period of time. FIG. 5 represents a sinusoidal signal that is input to inverter 316 at node 314. Reference numerals 500 and 504 indicate the high thresholds for inverter 316, and reference numerals 502 and 506 indicate the low thresholds for inverter 316. Referring now to FIG. 6, the output to inverter 316 is shown as a response to the input illustrated in FIG. 5. The output to inverter 316 is a pulse whose width is determined by the time it takes for the input signal to cross the threshold points of the inverter. When the voltage at node 314 goes higher than the high threshold, the output of the inverter 316 goes low. When the voltage at node 314 goes lower than the low threshold, the output of the inverter 316 goes high.

Figure 7:
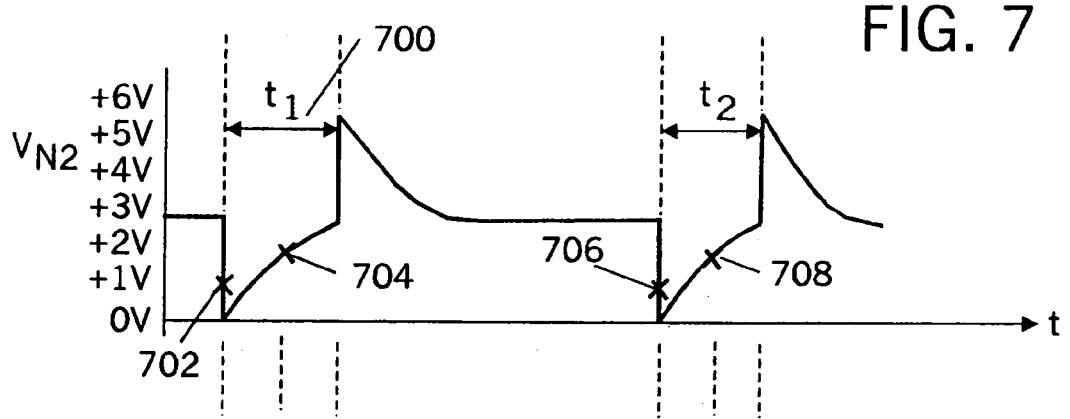
FIG. 7 is still another signal waveform illustration that is used in the description of operation of the circuitry of FIGS. 3A and 3B.

Referring to FIG. 7, the output of the differentiator is shown. This figure illustrates the output of the differentiator at node 330 in response to changes in voltage over time at its input, shown in FIG. 6. The voltage at node 330 is the voltage input to inverter 318. Reference numerals 702 and 706 indicate the low thresholds for inverter 318, and reference numerals 704 and 708 indicate the high thresholds for inverter 318. The time during which a high output is produced by inverter 318 is given by the following equation (wherein t is the time indicated in FIG. 7 at reference numeral 700, R is the resistance of resistor 332, and C is the capacitance of capacitor 328):

$$2 = 3*(1 - e^{(t/(R*C))})$$

Figure 8:
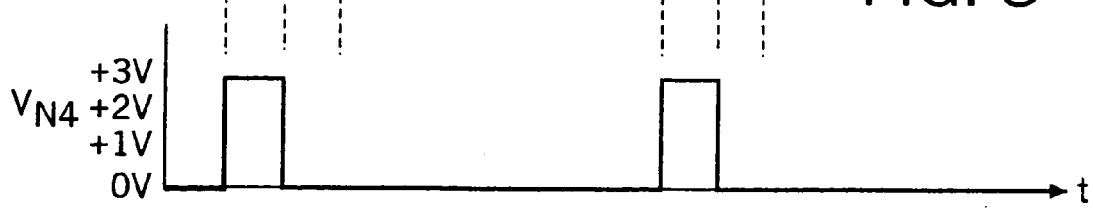
FIG. 8 is still another signal waveform illustration that is used in the description of operation of the circuitry of FIGS. 3A and 3B.

As shown in FIG. 8, due to the differentiator circuit, no matter how long it takes for the signal at node 314 to cross the threshold points of inverter 316, the pulse width at the output of inverter 318 is determined by this equation.

The only time that capacitor 336 charges is when the output of inverter 318 is high and the oscillator 354 output is high. Each time the antenna voltage crosses the high threshold of inverter 316, the output of inverter 318 goes high for a maximum time determined by the time constant of capacitor 328 and resistor 332. This differentiator along with the accumulating action of capacitor 336, and the sampling of the oscillator 354 assures that the probe responds only to continuous voltages in the frequency range of approximately 50 to 400 hertz.

Figure 9:
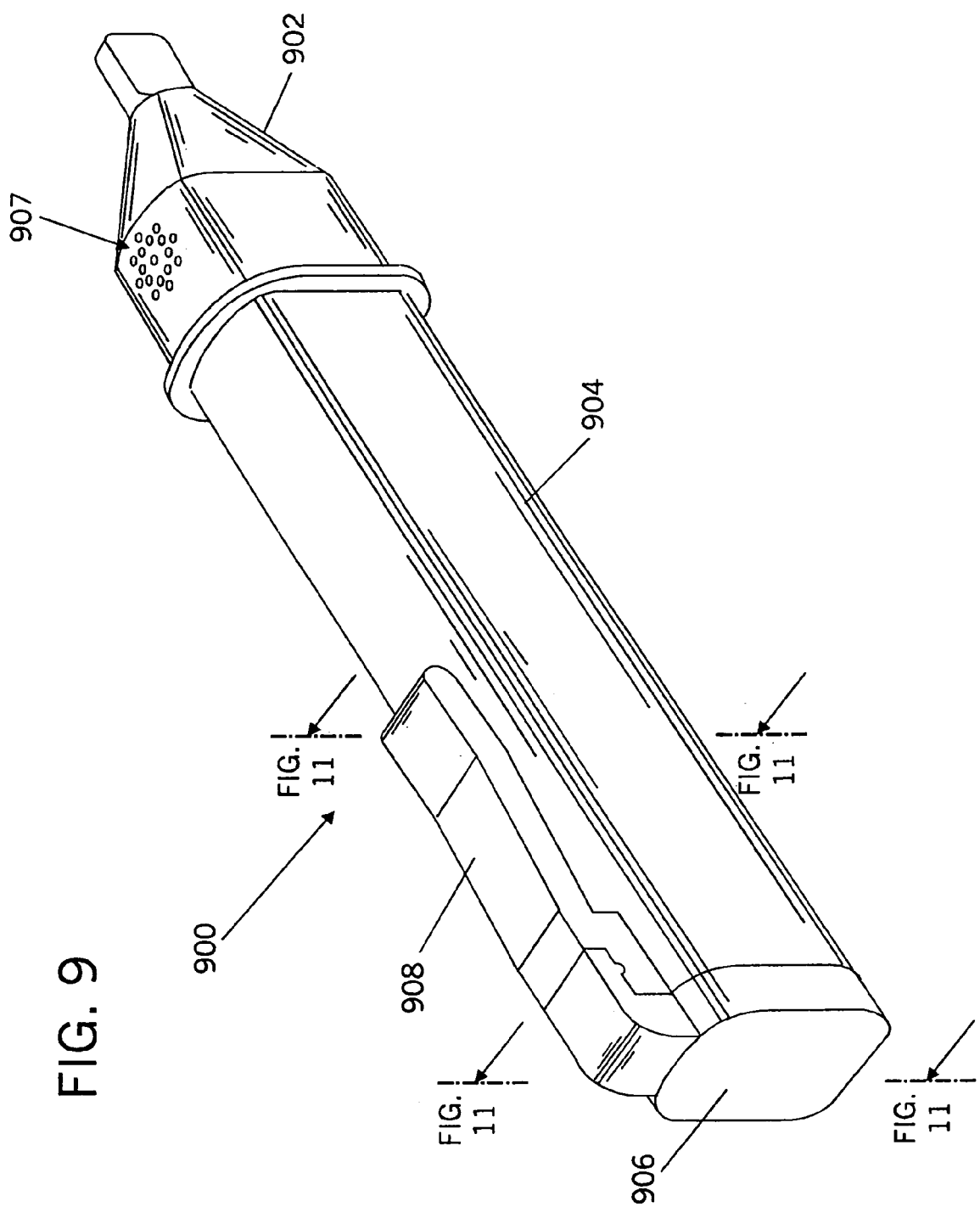
FIG. 9 is a perspective illustration of another embodiment of a hand-held electrical probe according to the present invention.

Referring now to FIG. 9, another embodiment of a hand-held electrical probe is generally shown at 900. The probe 900, which is similar to the probe disclosed in FIG. 1, includes a probe tip 902 attached to one end of a hollow housing 904. A clip 908 is connected to an opposite end of the housing 904 and is used to attach the probe 900 to an object such as a user's pocket. The opposite end of the housing 904 and clip 908 are adapted to allow for the attachment and removal of a cap 906 from the housing 904 and clip 908. Sound holes 907 pass through the probe tip 902 to an audible indicator in the interior so that sound may pass when the audible indicator is activated.

In order to reduce the possibility of electrical shock to the user, the probe tip 902, housing 904, and cap 906 of the probe 900 are formed entirely of a non-conductive material, such as an impact-resistant plastic, which is polyvinylchloride (PVC) in this embodiment. The probe tip 902 and housing 904 are attached by an adhesive.

Figure 10:
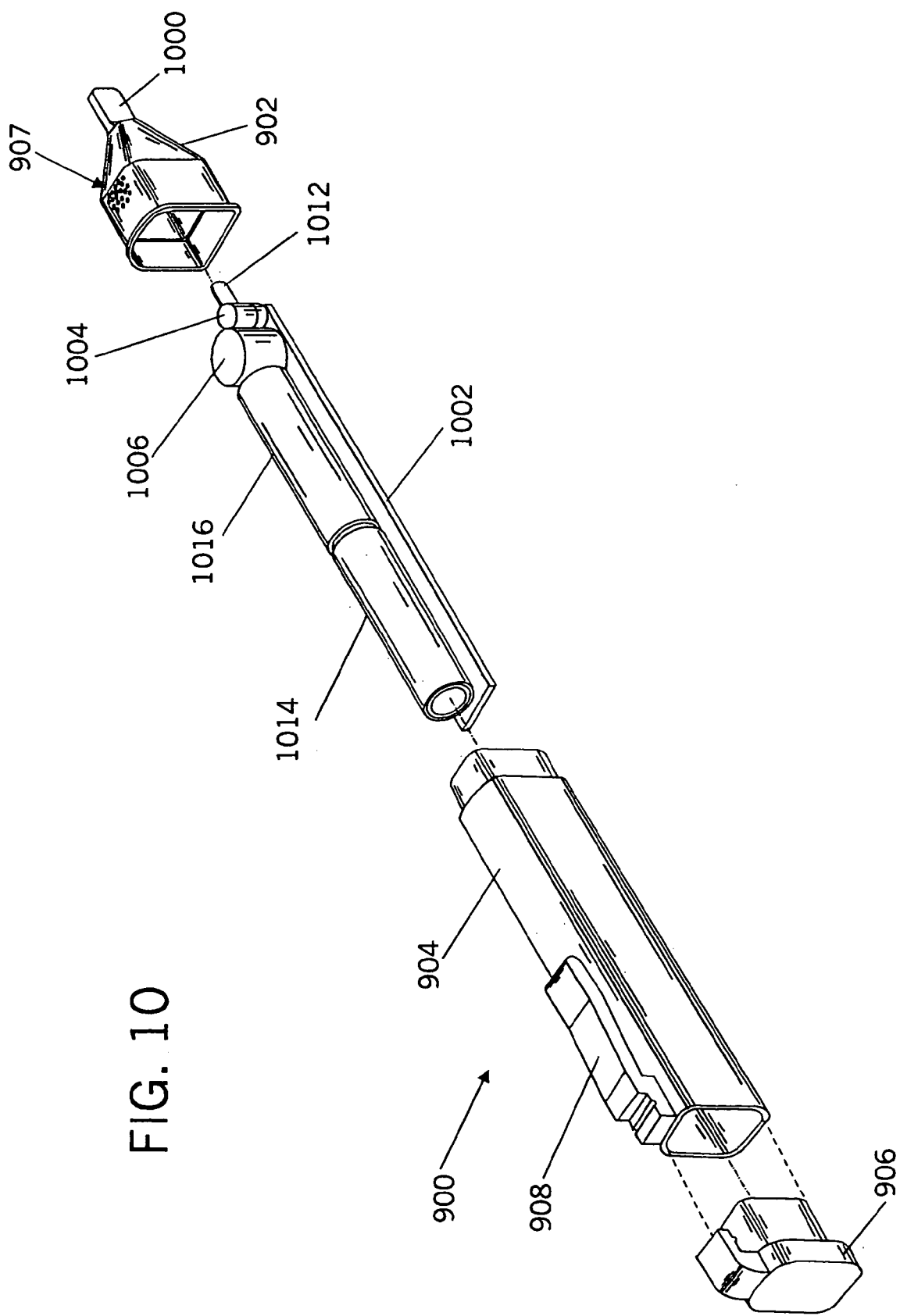
FIG. 10 is an exploded view of the embodiment of FIG. 9.

Referring now to FIG. 10, the probe 900 is illustrated in an exploded view in more detail. The probe tip 902 has a hollow interior and tip extension 1000. The probe tip 902 is formed of light-transmissive polyvinylchloride (PVC) material. The hollow interior of the housing 904 and probe tip 902 contain a circuit board 1002. The circuit board 1002 is mounted in the housing 904 in a manner that is well known to those skilled in the art. The circuit board 1002 includes circuitry (described previously in further detail and shown in FIGS. 3A and 3B), including an integrated circuit and an electromagnetic field indicator in the form of a light-emitting diode 1004 and an audible indicator 1006, or colloquially known as a "buzzer". In this embodiment, the indicators may be activated by the application of power. An antenna 1012, which is electrically conductive and formed of brass in this embodiment, is connected to the circuit board 1002 at one end. The opposite end of the antenna 1012 is embedded in the tip extension 1000 of the probe tip 902 so as to detect electromagnetic fields without contacting the source of the energy. The circuit board 1002 is connected to the antenna 1012 in order to receive signals indicating the presence of a detected electromagnetic field.

The housing 904 contains two small batteries, shown at reference numerals 1014 and 1016, for providing power to the circuitry of the probe 900. In this embodiment the batteries are each 1.5 volts. A pole at one end of the battery 1016 is engaged with a front contact (not shown) attached near the right end of the circuit board 1002. The batteries 1014 and 1016 have low and high voltage outputs. The front contact is a leaf-type spring in this embodiment.

Figure 11:
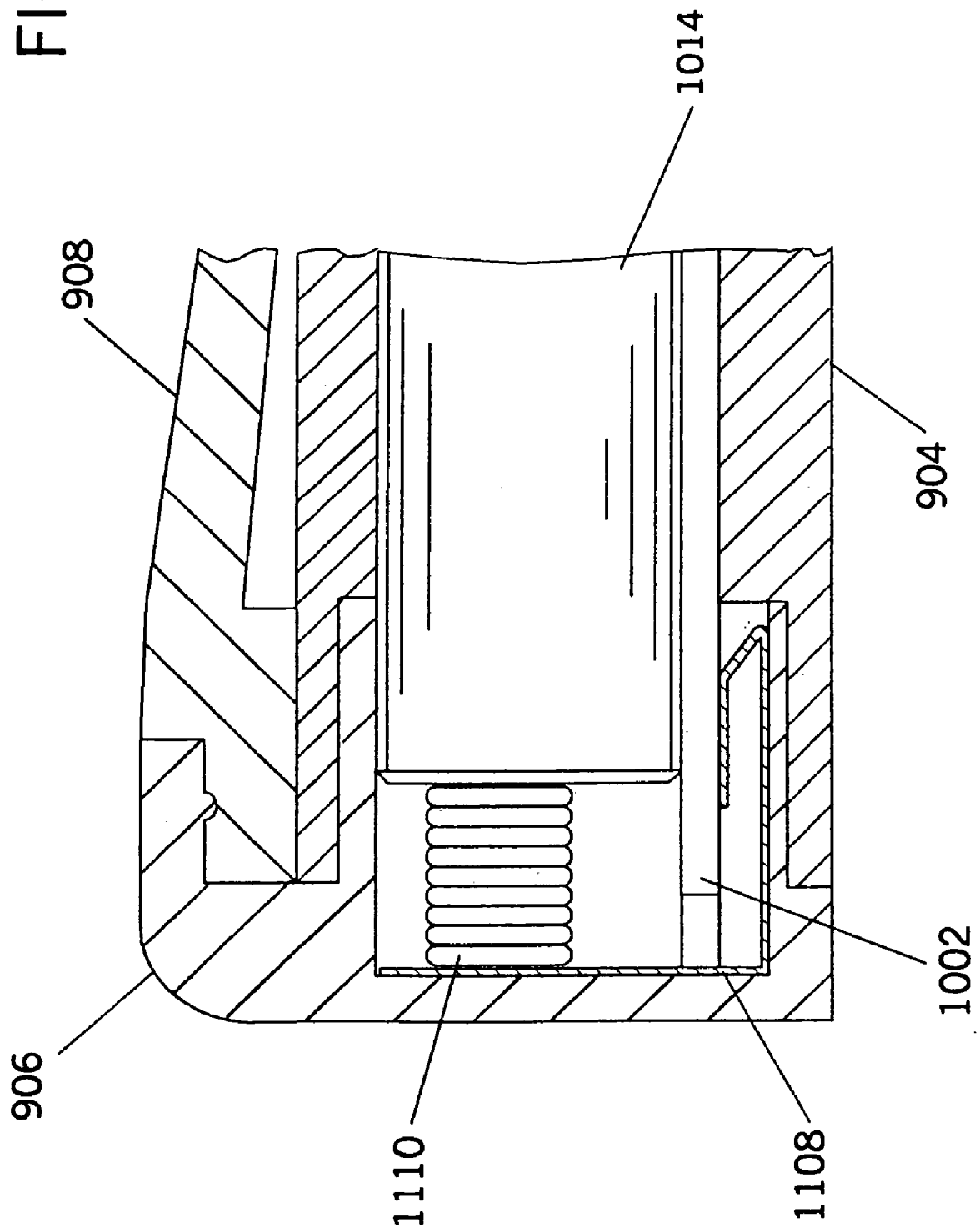
FIG. 11 is a vertical sectional view of the invention of FIG. 9 taken along the lines as shown in FIG. 9.

Referring now to FIG. 11, a vertical sectional view taken along the lines as shown in FIG. 9 provides more details of the probe 900. The cap 906 is shown attached to the housing 904 and clip 908. A rear contact 1108 is housed within the cap 906 along the interior rear surface of the cap 906 as shown and one end of the rear contact 1108 is electrically connected to a coil spring 1110 that is mounted within the cap 906. The rear contact 1108 is formed of brass in this embodiment, but may alternatively be formed of another suitable conducting material. The opposite end of the rear contact 1108 is adapted to engage the circuit board 1002 to form an electrical contact with the circuitry when the cap 906 is attached to the housing 904 and clip 908. The attachment of the cap 906, housing 904, and clip 908 forms an electrical circuit when the coil spring 1110 firmly engages the adjacent pole of battery 1014 pushing the batteries 1014 and 1016 into the housing 904 and in firm contact with the front contact of the circuit board 1002.

Figure 12A:
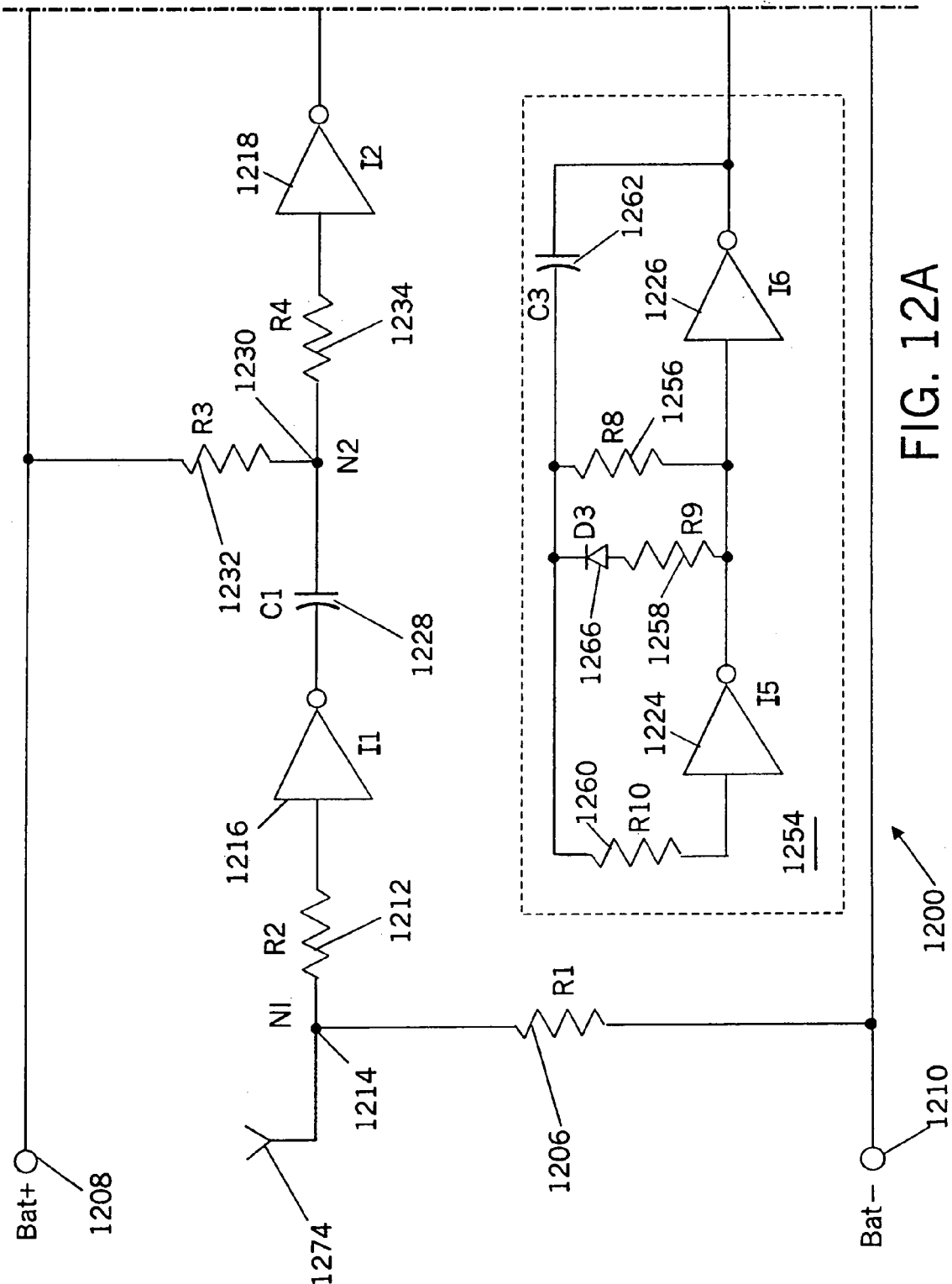
FIGS. 12A and 12B are a schematic diagram of circuitry used in the embodiment of FIGS. 1 and 9.
Figures 12, 12B:
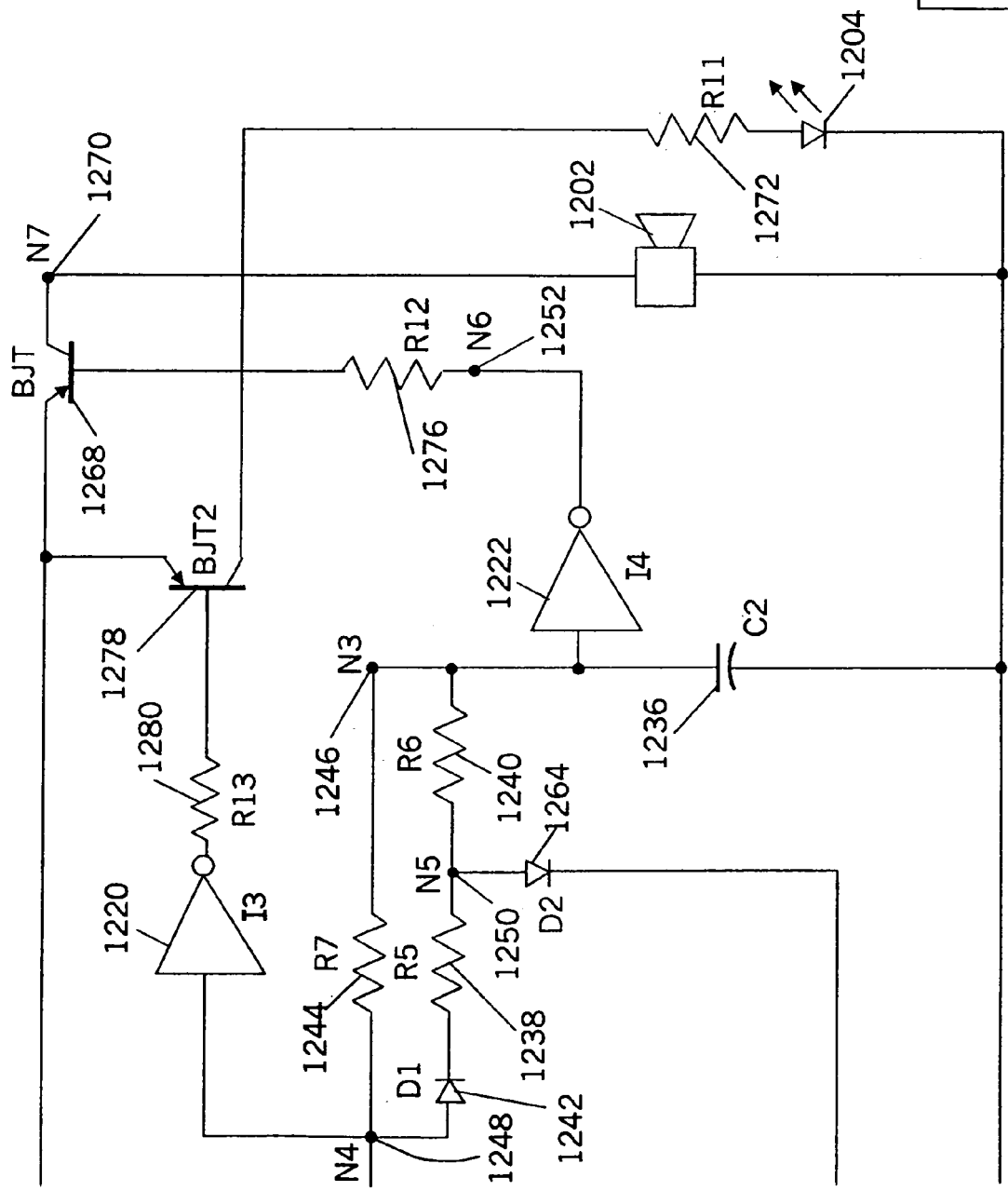

FIGS. 12A and 12B provide another embodiment of the circuitry as shown in FIGS. 3A and 3B that functions similar to circuit 300. While the circuitry described in FIGS. 12A and 12B may be included on the circuit board shown in either FIG. 2 or FIG. 10, for convenience, its use shall be described in connection with the probe as described and shown in FIG. 2. In this embodiment, circuit 1200 includes two indicators, an audible indicator 1202 and a visual indicator in the form of an LED 1204, that function to alert the user to the presence of certain electrical energy when activated. The schematic diagram of the circuit 1200 included on the circuit board 202 that is located within the probe tip 102 and housing 104 of the probe 100 (see FIG. 2). The circuit 1200 has an antenna 1274 to sense the presence of electrical energy radiated from an electrically conductive member, such as a wire, when the probe 100 is positioned near the member. The circuit 1200 activates LED 1204 when the presence of electrical energy that is sensed by antenna 1274 satisfies a certain measurement threshold. The audible indicator 1202 is activated by the circuit 1200 when presence of electrical energy is sensed by antenna 1274 that satisfies a certain measurement threshold and that satisfies that measurement threshold for a certain period of time. In this embodiment, the measurement threshold is satisfied when the radiated electrical energy from the conductive member is between approximately 50 to 400 hertz and is greater than approximately 40–50 volts. The activation of the indicators in circuit 1200 does not occur at approximately the same time, as was the case for the circuit found in FIGS. 3A and 3B. Activation circuitry is provided in circuit 1200 that receives a signal each time the threshold conditions are met. If enough signals are received during a period of time, the audible indicator 1202 is activated.

By allowing the activation of LED 1204 when the sensed electrical energy satisfies the measurement threshold, but not requiring that the sensed electrical energy satisfy the measurement threshold for a certain period of time, the probe 100 may be susceptible to intermittent activation of LED 1204 due to static charge build-up on the probe's housing as was discussed previously. This feature will enable a user to test the probe 100 before using it to make sure that it is working and to avoid the potential of a false negative reading caused by a lack of the battery power sufficient to active the indicators. The circuit 1200 allows a user to test the probe 100 by rubbing it on cloth in an effort to buildup a static charge sufficient to activate LED 1204.

In this embodiment, the circuit 1200 uses a 3.0 volt power source, which is provided by the batteries 214 and 216 shown in FIG. 2. The batteries 214 and 216 connect to the circuit 1200 at the nodes 1208 (BAT+) and 1210 (BAT−).

Antenna 1274 senses electrical energy on an electrically conductive member when positioned near the member. The antenna 1274 is connected to node 1214 (N1). Electrical energy sensed by the antenna 1274 causes a voltage to be produced at node 1214. It is important that circuit 1200 is sensitive only to certain electrical energy. In this embodiment, the configuration of resistor 1206 (R1) and inverter 1216 (I1) causes the circuit 1200 to be sensitive only to the electrical energy that is detected by the antenna 1274 above a certain voltage. In the preferred embodiment, resistor 1206 is a 330 megaohm resistor and is connected between nodes 1214 and 1210. In this embodiment, the resistor 1206 causes the circuit 1200 to be sensitive to detected voltages that are greater than approximately 40–50 volts.

The circuit 1200 includes an integrated circuit (IC) that contains several inverters shown individually on the schematic diagram of FIGS. 12A and 12B at reference numerals 1216, 1218, 1220, 1222, 1224, and 1226. The IC has the ability to perform many functions otherwise achievable by individual electrical components. The inverters (1216, 1218, 1220, 1222, 1224 and 1226) in this embodiment are CMOS Schmitt Trigger inverters. CMOS type circuits are known for low power consumption. The IC used in this embodiment can come from a variety of different companies such as Fairchild, Motorola, Texas Instrument or Toshiba. The batteries 214 and 216 supply power to the IC by connection at the appropriate pins on the IC as is known in the art. Additionally, the batteries 214 and 216 determine the threshold voltages and output for the inverters. For reference hereinafter, the high threshold voltage to an inverter is ⅔ the voltage of the power supplied to the IC, or 2.0 volts in this embodiment. Therefore, an input high to an inverter is a voltage greater than 2.0 volts in this embodiment. The low threshold voltage is ⅓ the voltage of the power supplied to the IC, or 1.0 volts in this embodiment. An output high from an inverter is approximately 3.0 volts, and an output low from an inverter is approximately zero. Furthermore, the batteries 214 and 216 provide power to the audible indicator 1202 and LED 1204 when activated.

Resistor 1212 (R2) is a 100 megaohm resistor and is connected between node 1214 and the input to inverter 1216. The resistor 1212 on the input to the inverter 1216 serves to prevent high input current from damaging the IC.

When the antenna 1274 is in close proximity to an electromagnetic field, a voltage is produced at node 1214 and at the input to inverter 1216. When antenna 1274 is not in the presence of an electromagnetic field (or a very small field), the output of the inverter 1216 will be high because of the low voltage present at the input. When a signal with a voltage magnitude greater than the high threshold of the inverter 1216 is present on the antenna 1274 the inverter's output will be low. The amount of the signal voltage that appears at the input of inverter 1216 is dependent upon the capacitance between the antenna 1274 and the signal source (usually a wire), the resistance of resistor 1206 and 1212, and the input capacitance of the inverter 1216.

Capacitor 1228 (C1) and resistor 1232 (R3) provide a high pass filter and are connected in a configuration between inverter 1216 and inverter 1218 (I2) in order to provide AC coupling and function as a differentiator. Capacitor 1228 is a 0.1 microfarad capacitor that is connected between the output of inverter 1216 and node 1230 (N2). Resistor 1232 is a 100 kiloohm resistor that is connected between nodes 1230 and 1208. The time constant of the capacitor 1228 and resistor 1232 is given by the multiplication of the capacitance value of capacitor 1228 and the resistance value of resistor 1232, which is 10 milliseconds. This feature functions to enable the circuit 1200 to respond to only continuous time varying signals. This feature is helpful during operation, for example, when the distance varies between the probe tip 102 (see FIG. 1) and a wire that is probed, thus, causing a varying sensed signal. This varying of the distance, possibly due to a user moving the probe, could potentially cause the voltage at inverter 1216 to vary enough to give an inaccurate reading. The differentiator is described in more detail hereinafter.

The output of inverter 1218 changes in response to certain changes in the input of inverter 1216. A voltage magnitude greater than the high threshold for inverter 1216 will cause the output to inverter 1216 to go high at certain frequencies. As discussed hereinbefore, this change will affect the voltage present at node 1230 if it passes the differentiator configuration of capacitor 1228 and resistor 1232. Therefore, the configuration of inverter 1216, resistor 1206, capacitor 1228, and resistor 1232 serves to filter voltages present at node 1214 (voltages from the antenna 1274) that are at a certain minimum voltage and a certain frequency. Additionally, that configuration provides a logic input to inverter 1218 when the filter conditions are met. When the filter conditions are met, the output of inverter 1218 at node 1248 (N4) will change from low to high. Otherwise, the output of inverter 1218 is low. The operation of inverter 1216, inverter 1218, and the differentiator are described in more detail hereinafter.

Resistor 1234 (R4) is a 1.0 megaohm resistor that is connected between node 1230 and the input to inverter 1218. The resistor 1234 serves to prevent a high input current from damaging the IC.

The input to inverter 1220 (I3) is connected to node 1248. A 1.0 kiloohm resister 1280 (R13) is connected between the output of inverter 1220 and the base of bipolar junction transistor (BJT2) 1278 to limit the current into BJT2 1278. A 150 ohm resistor 1272 (R11) and LED 1204 are connected in series between the collector of BJT2 1278 and node 1210. The emitter of BJT2 is connected to node 1208. BJT2 functions as a switch for activating LED 1204. The switch is turned on when the filter conditions are met, as was discussed previously, and the output voltage of inverter 1218 reaches the high threshold of inverter 1220. When inverter 1220 has a high output, no battery power is applied to LED 1204. A low output turns on BJT2, thereby applying battery power to resistor 1272 and LED 1204. This design allows for the activation of LED 1204 when the sensed electrical energy satisfies the measurement threshold, but it does not require that the sensed electrical energy satisfy the measurement threshold for a certain period of time as was the case in the circuit found in FIGS. 3A and 3B.

When the output to inverter 1218 is high, capacitor 1236 (C2), which is a 0.33 microfarad capacitor, is charging. The capacitor 1236 is charged through diode 1242 (D1), resistor 1238 (R5), and resistor 1240 (R6) in parallel with resistor 1244 (R7). The voltage on the capacitor during the time the capacitor 1236 is charging is determined by the following equation (wherein V is the capacitor voltage, Vcc is the battery voltage (3.0 volts), Vc is the voltage existing on the capacitor 1236, t is the time the capacitor is being charged, R is the resistance of resistors 1238 and 1240, and C is the capacitance of capacitor 1236:

$$V = (Vcc - Vc) * (1 - e^{(-t/(R*C))})$$

While the capacitor is being charged, its voltage increases exponentially with time.

The anode of diode 1242 is connected to node 1248. Diode 1242 serves to prevent capacitor 1236 from discharging into the inverter 1218. Resistor 1244 is a 1.0 megaohm resistor that is connected between node 1248 and node 1246 (N3). Resistor 1244 functions to allow capacitor 1236 to slowly discharge back into inverter 1218.

Resistor 1238 is a 47.0 kiloohm resistor that is connected between the cathode of diode 1242 and node 1250 (N5). Resistor 1240 is a 47.0 kiloohm resistor that is connected between nodes 1250 and 1246. Resistors 1238 and 1240 determine the amount of charge added to capacitor 1236 when a pulse of voltage is received from inverter 1218.

The input to inverter 1222 (I4) is connected to node 1246, and the output of inverter 1222 is connected to node 1252 (N6). A 500 ohm resistor 1276 (R12) is connect to node 1252 and the base of bipolar junction transistor (BJT) 1268 to limit the current into BJT 1268.

The output to inverter 1222 is high while the voltage on capacitor 1236 is below the high threshold. When the capacitor 1236 voltage is above the threshold voltage, the inverter's output is low. As detailed hereinafter, a low output on inverter 1222 causes audible indicator 1202 to sound. Inverter 1222 applies power through BJT 1268 to the audible indicator 1202.

An oscillator 1254 is connected to capacitor 1236 through resistor 1240 and diode 1264 (D2). The oscillator 1254 serves as a timer to limit the amount of time that capacitor 1236 is charged. The indicator will be activated only on the condition that capacitor 1236 is charged beyond a certain threshold voltage during a period of time set by the oscillator 1254. The oscillator 1254 is an astable multivibrator that continuously produces an output signal that has a period determined by resistor 1256 (R8), resistor 1258 (R9), capacitor 1262 (C3), inverter 1224 (I5), and inverter 1226 (I6). The oscillator 1254 produces a non-symmetrical square wave with a peak-to-peak voltage of 3.0 volts. The capacitor 1236 discharges when the oscillator's output is low. Therefore, in order for the indicator to activate, the voltage across capacitor 1236 must be greater than the threshold voltage before oscillator 1254 goes low. The capacitor 1236 will charge only when the oscillator is high and the output from inverter 1218 is high. In this embodiment, the time period that the oscillator's output is low is approximately 103.5 milliseconds, and the time period that the oscillator's output is high is approximately 290 milliseconds in this embodiment. The oscillator 1254 discharges through resistor 1240 and diode 1264 when the oscillator's output is low. Diode 1264 serves to keep the oscillator's output from charging capacitor 1236 when the oscillator's output is high.

In this embodiment, resistor 1256, resistor 1258, and capacitor 1262 are 180 kiloohms, 100 kiloohms, and 1.0 microfarads respectively. The oscillator 1254 further includes resistor 1260 (R10), which is 1.0 megaohm resistor, and diode 1266 (D3). Resistor 1260 functions to limit the current into the inverter 1224. When the output of the oscillator 1254 is low, capacitor 1236 is discharged through resistor 1240 and diode 1264. This reduces the voltage on capacitor 1262 below the low threshold causing the output of inverter 1222 to go high. The time required for capacitor 1236 to discharge to the low threshold of inverter 1222 is given by the following equation (wherein Vc is the voltage on capacitor 1236 before discharge, R is the resistance of resistor 1240, C is the capacitance of capacitor 1236 and V is the low threshold voltage of the inverter):

$$T = -R*C*ln(V/Vc)$$

In this embodiment of the circuit, the period of the output signal of oscillator 354, as compared to the same signal in the circuit shown in FIGS. 3A and 3B, was reduced in order to increase the rate at which the audible indicator 1202 is activated when the electrical energy sensed by antenna 1274 satisfies the measurement threshold for a certain period of time. This is accomplished by reducing the value for resistor 1258 from 270 kiloohms to 100 kiloohms. The reduction in the period of the output signal of oscillator 354 also results in the need to adjust the values of various other components in the circuit to insure that the probe will operate properly when exposed to continuous voltages at lower frequencies within the frequency range of approximately 50 to 400 hertz. The maximum time that the output of inverter 1218 goes high must be increased by adjusting the time constant of capacitor 1228 and resistor 1232 in order to allow capacitor 1236 to charge sufficiently at lower frequencies, and capacitor 1236 must be allowed to discharge more quickly back into inverter 1218 by reducing the value of resistor 1244.

Figure 13:
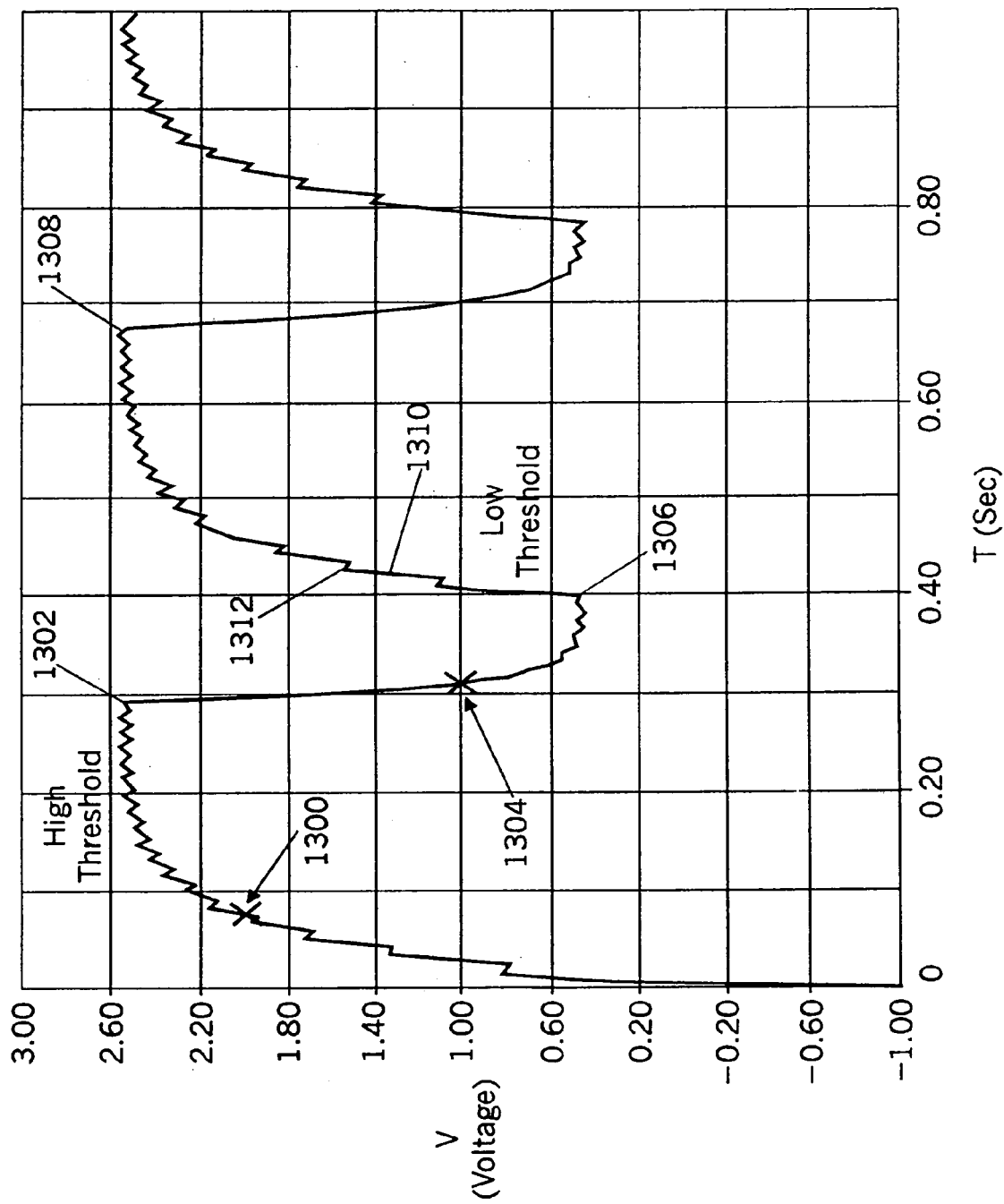
FIG. 13 is a signal waveform illustration that is used in the description of operation of the circuitry of FIGS. 12A and 12B.

Referring now to FIG. 13, a voltage versus time diagram illustrates the voltage across capacitor 1236 over time while there is a 60 Hz signal at the antenna 1274 above the voltage threshold. The voltage at which the input to inverter 1222 is at high and low threshold is shown at reference numerals 1300 and 1304 respectively. The period of time that begins when the voltage goes to the high threshold of the inverter 1300 to the time the voltage goes to the low threshold at 1304 is the time period that the indicator is activated (as described in further detail hereinafter). As this voltage varies between the low threshold and the high threshold of inverter 1222, the output of the inverter changes from high to low and back to high. This occurs at the frequency rate of the oscillator 1254. The period of time that begins at reference number 1302 to 1306 indicates when the capacitor 1236 is discharging. From the time referenced by 1306 to 1308, it is indicated when the capacitor 1236 is charging. Reference numeral 1310 indicates the time period in which the inverter 1218 is charging the capacitor 1236 with a pulse. Reference numeral 1312 indicates the time period in which the inverter 1218 is not pulsing and the capacitor 1236 is discharging through resistor 1244.

Referring back to FIGS. 12A and 12B, the configuration of inverter 1222 and BJT 1268 functions as a switch for activating the audible indicator 1202. The switch is turned on when the voltage at capacitor 1236 reaches the high threshold of inverter 1222. When inverter 1222 has a high output, no battery power is applied to audible indicator 1202. A low output turns on BJT 1268, thereby applying battery power to node 1270 (N7). The BJT 1268 is connected as follows: the emitter is connected to node 1208; the base is connected to resistor 1276; and the collector is connected to node 1270.

When battery power is applied to node 1270 the audible indicator 1202 is activated, thereby alerting the user to the presence of a constantly changing AC voltage above a certain voltage threshold. The audible indicator 1202 is connected between nodes 1270 and 1210. When powered, the audible indicator 1202 activates (switches on and off) at the oscillator's frequency rate. In this embodiment, the indicator will be on for approximately 290 milliseconds and off for approximately 103.5 milliseconds.

Figure 14:
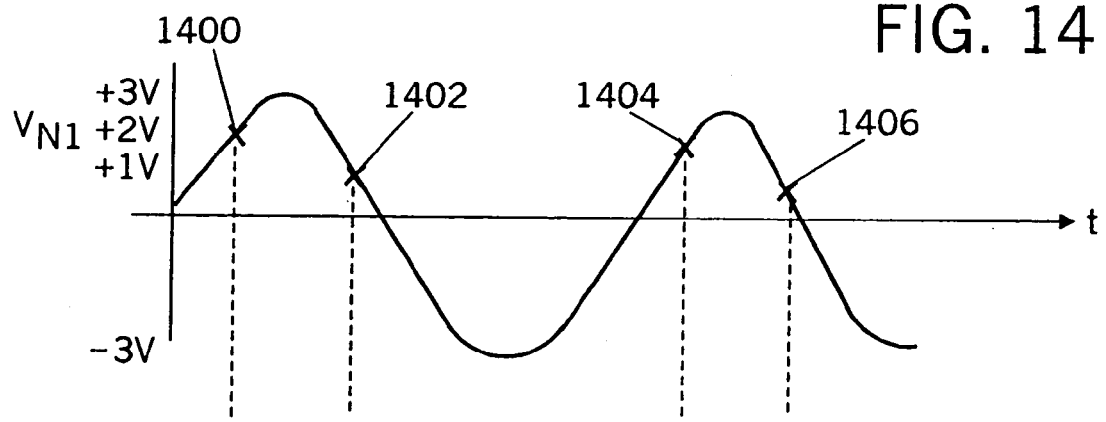
FIG. 14 is another signal waveform illustration that is used in the description of operation of the circuitry of FIGS. 12A and 12B.
Figure 15:
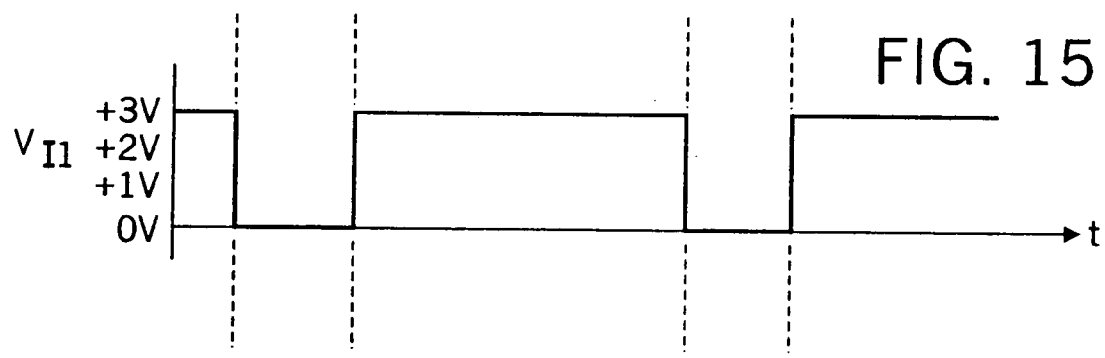
FIG. 15 is still another signal waveform illustration that is used in the description of operation of the circuitry of FIGS. 12A and 12B.

Referring to FIGS. 14–17, voltage versus time diagrams are provided to illustrate the operation of the differentiator of the present invention. These voltages indicate the voltages present at various points on the circuit 1200 during the same period of time. FIG. 14 represents a sinusoidal signal that is input to inverter 1216 at node 1214. Reference numerals 1400 and 1404 indicate the high thresholds for inverter 1216, and reference numerals 1402 and 1406 indicate the low thresholds for inverter 1216. Referring now to FIG. 15, the output to inverter 1216 is shown as a response to the input illustrated in FIG. 14. The output to inverter 1216 is a pulse whose width is determined by the time it takes for the input signal to cross the threshold points of the inverter. When the voltage at node 1214 goes higher than the high threshold, the output of the inverter 1216 goes low. When the voltage at node 1214 goes lower than the low threshold, the output of the inverter 1216 goes high.

Figure 16:
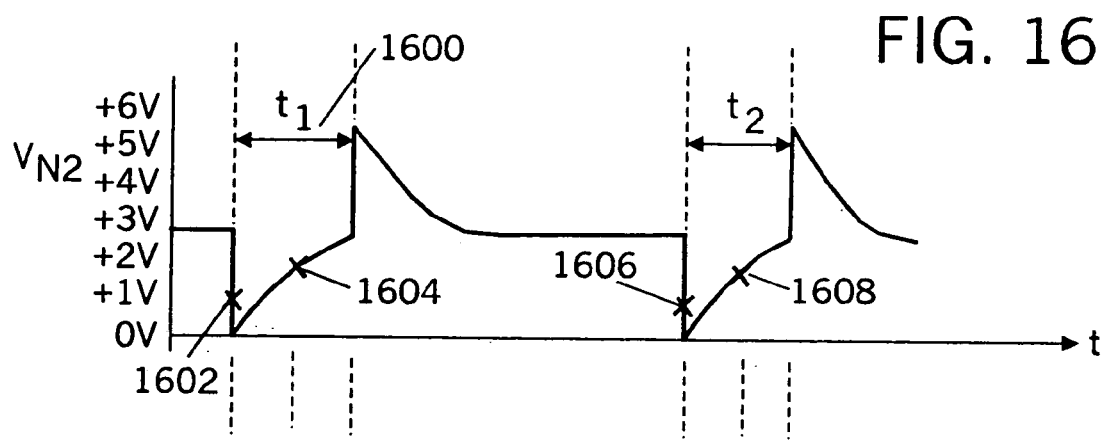
FIG. 16 is still another signal waveform illustration that is used in the description of operation of the circuitry of FIGS. 12A and 12B.

Referring to FIG. 16, the output of the differentiator is shown. This figure illustrates the output of the differentiator at node 1230 in response to changes in voltage over time at its input, shown in FIG. 15. The voltage at node 1230 is the voltage input to inverter 1218. Reference numerals 1602 and 1606 indicate the low thresholds for inverter 1218, and reference numerals 1604 and 1608 indicate the high thresholds for inverter 1218. The time during which a high output is produced by inverter 1218 is given by the following equation (wherein t is the time indicated in FIG. 16 at reference numeral 1600, R is the resistance of resistor 1232, and C is the capacitance of capacitor 1228):

$$2=3*(1-e^{(t/(R*C))})$$

Figure 17:
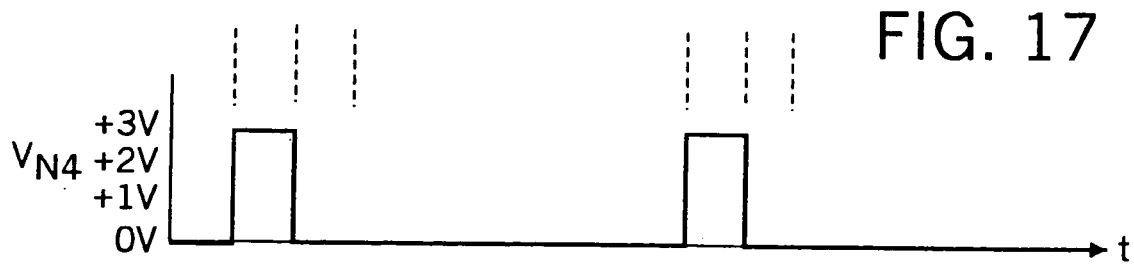
FIG. 17 is still another signal waveform illustration that is used in the description of operation of the circuitry of FIGS. 12A and 12B.

As shown in FIG. 17, due to the differentiator circuit, no matter how long it takes for the signal at node 1214 to cross the threshold points of inverter 1216, the pulse width at the output of inverter 1218 is determined by this equation.

The only time that capacitor 1236 charges is when the output of inverter 1218 is high and the oscillator 1254 output is high. Each time the antenna voltage crosses the high threshold of inverter 1216, the output of inverter 1218 goes high for a maximum time determined by the time constant of capacitor 1228 and resistor 1232. This differentiator along with the accumulating action of capacitor 1236, and the sampling of the oscillator 1254 assures that the probe responds only to continuous voltages in the frequency range of approximately 50 to 400 hertz.

Although the invention has been shown and described with respect to a best mode embodiment thereof, it should be understood by those skilled in the art that various changes, omissions, and additions may be made to the form and detail of the disclosed embodiment without departing from the spirit and scope of the invention, as recited in the following claims.

The invention claimed is:

1. A probe for alerting a user to the presence of electrical energy on a conductive member, the probe comprising:
   an antenna to sense electrical energy;
   an indicator to alert a user when activated by activation and detection circuitry;
   activation and detection circuitry connected to the antenna and the indicator, the activation and detection circuitry for reducing intermittent activation of the indicator due to static charge accumulation by activating the indicator when the electrical energy sensed by the antenna has met a measurement threshold a plurality of times during a period of time.

2. The probe of claim 1, wherein the indicator includes a switch for applying power to the indicator.

3. The probe of claim 1, wherein the activation and detection circuitry includes means for adjusting the rate at which the indicator is activated.

4. The probe of claim 1, wherein the activation and detection circuitry filters the magnitude and frequency of the sensed electrical energy.

5. The probe of claim 1 wherein the activation and detection circuitry reduces battery drain.

6. The probe of claim 1 further comprising means for adjusting the sensitivity of the probe to certain voltages sensed by the antenna.

7. A method for alerting a user to the presence of electrical energy on an electrically conductive member, comprising:
   sensing the electrical energy radiated from the member;
   reducing intermittent activation of an indicator due to static charge accumulation by activating the indicator when the electrical energy sensed has met a measurement threshold a plurality of times during a period of time; and
   alerting the user when the indicator is activated.

8. The method of claim 7 further comprising:
   responding only to a range of voltages sensed on an antenna.

9. The method of claim 8 further comprising:
   responding only to a range of frequencies sensed on an antenna.

* * * * *